United States Patent
Heydari

(10) Patent No.: US 9,445,531 B1
(45) Date of Patent: Sep. 13, 2016

(54) AIR WASHING FOR OPEN AIR COOLING OF DATA CENTERS

(71) Applicant: Ali Heydari, El Cerrito, CA (US)

(72) Inventor: Ali Heydari, El Cerrito, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 28 days.

(21) Appl. No.: 14/702,617

(22) Filed: May 1, 2015

(51) Int. Cl.
*H05K 7/20* (2006.01)
*H05K 7/14* (2006.01)
*H01L 23/473* (2006.01)

(52) U.S. Cl.
CPC ........ *H05K 7/20827* (2013.01); *H05K 7/1497* (2013.01); *H05K 7/20836* (2013.01)

(58) Field of Classification Search
CPC .............. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........ 361/676–678, 679.46–679.54, 361/688–723, 699–704, 709–710, 361/719–721; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 4,484,937 A | 11/1984 | James et al. | |
| 5,675,473 A * | 10/1997 | McDunn | H05K 9/0037 165/80.4 |
| 5,831,824 A * | 11/1998 | McDunn | H05K 7/20345 361/699 |
| 6,451,096 B1 | 9/2002 | Kim | |
| 7,905,096 B1 | 3/2011 | Campbell et al. | |
| 2008/0185446 A1 | 8/2008 | Tozer | |
| 2010/0033921 A1* | 2/2010 | Copeland | H05K 7/20781 361/679.47 |
| 2010/0039773 A1* | 2/2010 | Tilton | H01L 23/427 361/699 |
| 2010/0110626 A1* | 5/2010 | Schmitt | H05K 7/20745 361/679.47 |
| 2010/0134972 A1* | 6/2010 | Moss | H05K 7/20736 361/679.49 |

(Continued)

FOREIGN PATENT DOCUMENTS

CN 202140108 2/2012

OTHER PUBLICATIONS

PCT/US16/21777, International Search Report and Written Opinion, Date of Mailing Jun. 3, 2016, 19 pages.

*Primary Examiner* — Anthony Haughton
*Assistant Examiner* — Razeem Gafur
(74) *Attorney, Agent, or Firm* — Blakely, Sokoloff, Taylor & Zafman LLP

(57) ABSTRACT

A data center system includes a housing to house servers arranged in electronic racks and an air supply system to receive contaminated air from an external environment of the housing. The datacenter system further includes a misting and cooling system to clean and cool the contaminated air. The misting and cooling system includes a cooling and cleaning chamber to receive the contaminated air and nozzles to spray liquid droplets into the contaminated air within the cooling and cleaning chamber. The liquid droplets collect and remove at least a portion of the particles contained in the contaminated air to generate non-contaminated air. The data center system further includes an airflow delivery system to generate an airflow from the non-contaminated air to cause the airflow to travel through the servers of the electronic racks to exchange heat generated by the servers due to operations of the servers.

20 Claims, 7 Drawing Sheets

(56) References Cited

U.S. PATENT DOCUMENTS

| | | | |
|---|---|---|---|
| 2010/0165572 A1* | 7/2010 | Fink | H05K 7/20 361/695 |
| 2010/0195283 A1* | 8/2010 | Yoshimaru | H05K 7/20736 361/695 |
| 2010/0321874 A1* | 12/2010 | Bhattacharyya | H05K 7/20736 361/679.5 |
| 2011/0026225 A1* | 2/2011 | Ostwald | H05K 7/20645 361/699 |
| 2011/0063778 A1* | 3/2011 | Brouillard | H05K 7/20645 361/678 |
| 2011/0063792 A1* | 3/2011 | Schmidt | G06F 1/20 361/679.46 |
| 2011/0128699 A1* | 6/2011 | Heydari | H05K 7/20745 361/679.48 |
| 2011/0175498 A1 | 7/2011 | Bash et al. | |
| 2012/0033379 A1* | 2/2012 | Lam | H05K 7/20145 361/695 |
| 2012/0050986 A1* | 3/2012 | Riebel | H05K 7/1488 361/679.48 |
| 2012/0069514 A1* | 3/2012 | Ross | H05K 7/20727 361/679.33 |
| 2012/0147560 A1* | 6/2012 | Zeng | H05K 7/20545 361/690 |
| 2013/0062047 A1* | 3/2013 | Vaney | H05K 7/20836 165/287 |
| 2013/0063888 A1* | 3/2013 | Wang | H05K 7/20736 361/679.48 |
| 2013/0182388 A1* | 7/2013 | Wu | H05K 7/20827 361/679.48 |
| 2013/0194755 A1* | 8/2013 | Ling | H05K 7/20545 361/721 |
| 2013/0201618 A1* | 8/2013 | Czamara | H05K 7/1497 361/679.5 |
| 2013/0286587 A1* | 10/2013 | Martini | F24F 11/0001 361/695 |
| 2013/0301219 A1* | 11/2013 | Knudsen | H05K 7/20154 361/697 |
| 2013/0308266 A1* | 11/2013 | Sullivan | G06F 1/20 361/679.46 |
| 2013/0314865 A1* | 11/2013 | Chuang | G06F 1/26 361/679.02 |
| 2013/0329364 A1* | 12/2013 | Kameno | H05K 7/20563 361/697 |
| 2013/0342993 A1* | 12/2013 | Singleton | H05K 7/20836 361/690 |
| 2013/0342996 A1* | 12/2013 | Fricker | H05K 7/1441 361/695 |
| 2013/0343005 A1* | 12/2013 | David | H05K 13/00 361/721 |
| 2014/0170951 A1 | 6/2014 | Ryu et al. | |
| 2015/0053430 A1 | 2/2015 | Beresford | |

* cited by examiner

AIR WASHING FOR OPEN AIR COOLING OF DATA CENTERS

FIELD OF THE INVENTION

Embodiments of the present invention relate generally to data centers. More particularly, embodiments of the invention relate to a misting and cooling system for cooling and cleaning air used to cool servers of a data center.

BACKGROUND

Heat removal is a prominent factor in computer system and data center design. The number of servers deployed within a data center has steadily increased as server performance has improved, thereby increasing the amount of heat generated during the regular operation of the servers. The reliability of servers used within a data center decreases if the environment in which they operate is permitted to increase in temperature over time. A significant portion of the data center's power is used for cooling electronics at the server level. As the number of servers within a data center increase, a greater portion of the power is commensurately consumed by the data center to cool electronic components within the servers.

In conventional data structures, a computer room air conditioner (CRAC) circulates cold air throughout a data center. Conventionally, the CRAC is a closed-loop system that cools returning air drawn from within the data center and recirculates the cooled air to the servers within the data center. Because air drawn by the CRAC originates within the data center, the air has an increased temperature from cooling the servers in the data center. As the power used by the servers within a data center increases, so does the power used by the CRAC to cool the return air. This closed loop also increases the power and associated cost for data center operation.

Recently, some cooling systems utilize fresh air drawn from the external environment without recycling the air within a data center. However, such a system may not be efficient in some areas in which the fresh air may be contaminated as it may contain dusts or other chemical particles that are above a certain level. Such poor air quality may further damage the servers of a data center.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, liquid is utilized for the purpose of cooling as well as a washing medium for reducing or removing unwanted particles in the air, such as, for example, hazardous and undesirable contaminates that may be in the circulated or uncirculated fresh air, which is used in IT (information technology) containers as well as data centers.

In one embodiment, the fresh, polluted, and non-conditioned air passes through an air filter as needed as a first measure of separating particles and pollutants from the air. The filtered air then passes through an air-washing spray cooling system, also referred to as a misting and cooling system described below, where multiplies of precisely designed spray nozzles spray and push liquid droplets (e.g., water drops) with a specific size and velocity into the incoming filtered air. The passing of the filtered air causes additional pollutants and particles that were not collected at the air filter be washed away from the air.

Additionally, atomization of mists of liquid drops due to the high speed passage of the air causes evaporative cooling of the air due to enthalpy change of the liquid particles to vapor. Further, a liquid recycle system may be utilized to collect and recycle the liquid drops with the pollutants or particles collected from the air. Specifically, a liquid separation blade is utilized to collect and prevent any of the liquid droplets to travel with the air into the racks of IT equipment of a data center. A moisture control system may be utilized to control or adjust the air moisture to an optimal desirable level by adjusting a liquid flow as well as injecting recirculated air for a predetermined air moisture level. The conditioned, purified, cooled, and moist air is then used to cool the entire fleet of the hardware in the data center.

Figure 1A:
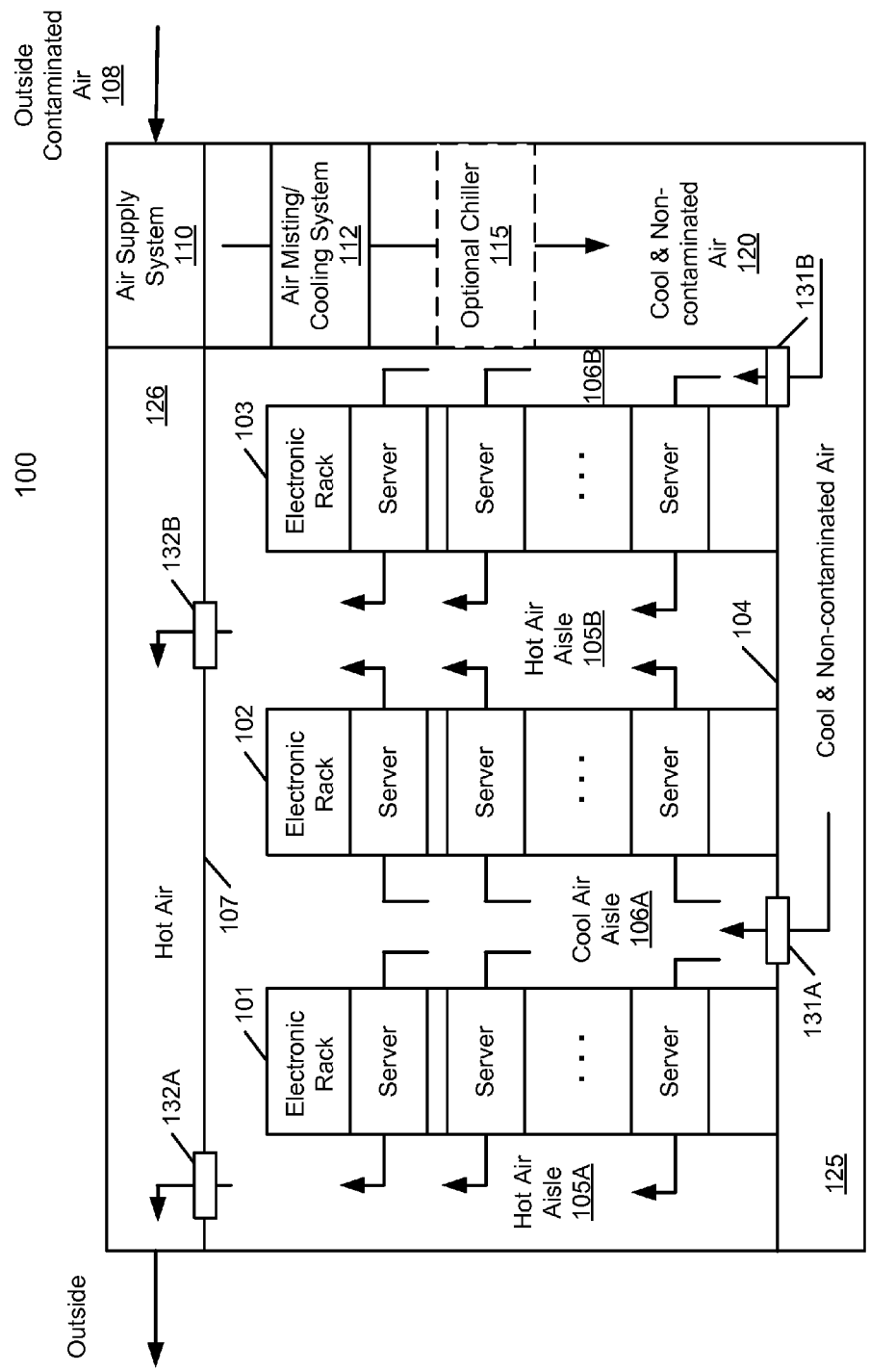
FIGS. 1A and 1B are block diagrams illustrating a data center system according to one embodiment of the invention.
Figure 1B:
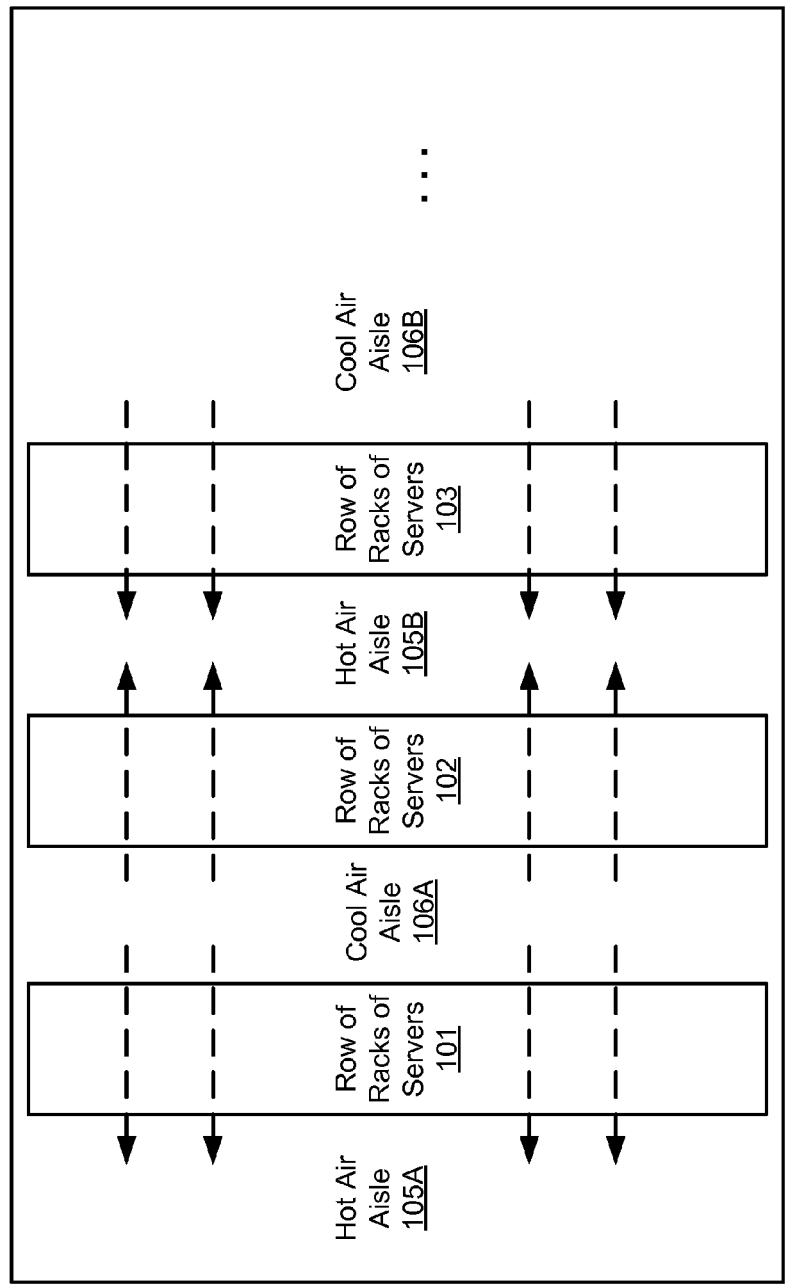

FIGS. 1A and 1B are block diagrams illustrating a data center system according to one embodiment of the invention. In this example, a cross-section view or side view of a data center system is shown in FIG. 1A while a top view of the data center system is shown in FIG. 1B. Referring to FIG. 1A, data center system 100 includes a housing structure, such as a room or a container, to house rows of racks of IT equipment or instruments 101-103, in this example, computer servers that provide data services. Although only three rows of racks 101-103 are shown, more or fewer rows may be applied. The rows of electronic racks 101-103 are arranged in such a way to form aisles between every two rows, including hot air aisles 105A-105B and cool air aisles 106A-106B in this example.

In one embodiment, data center system 100 further includes an air supply system 110 (also referred to as an air supply unit), an air misting and cooling system 112, and optional chiller 115. Air supply system 110 is configured to take in or draw fresh, possibly polluted, and non-conditioned air, also referred to as contaminated air 108, from an external environment into the housing of the data center system. Air supply system 110 may include one or more intake fans to draw in contaminated air 108 and one or more air filters to filter contaminated air 108, generating filtered air. The filters may reduce a portion of the particles or pollutants in the contaminated air 108. However, the filters may not be sufficient to remove a significant portion of the particles or pollutants.

In one embodiment, the filtered air is fed into an ingress interface or inlet port of misting and cooling system 112. Misting and cooling system 112 includes a misting and cooling chamber to receive the filtered air and an array of nozzles arranged in a particular configuration or layout to spray or blow a fine mist of liquid drops, such as, for example, water drops, into the filtered air received within the misting and cooling chamber (e.g., direct contact) to collect and remove at least some of the particles or pollutants in the filtered air (e.g., dust). The size and the velocity or pressure of the liquid droplets are controlled and/or adjusted to be at an optimum level, such that the liquid droplets can collect and remove the maximum level of the particles or pollutants in the filtered air. In addition, according to one embodiment, atomization of mists of liquid drops due to the high speed passage of the filtered air causes evaporative cooling of the air due to enthalpy change of the liquid droplets to vapor. As a result, cooler air with reduced particles or pollutants is emitted from an egress interface or outlet port of misting and cooling system 112, also referred to cool and non-contaminated air 120. The term of non-contaminated air refers to the air having a level of particles or pollutants that is below a predetermined threshold.

Optionally, if there is a need, an optional chiller 115 may be utilized to further decrease the temperature of the cool and non-contaminated air 120. Similar to an air conditioning system, a chiller is a machine that removes heat from a liquid via a vapor-compression or absorption refrigeration cycle. This liquid can then be circulated through a heat exchanger to cool air, in this example, cool and non-contaminated air 120. Dependent upon the specific requirement of cool and non-contaminated air 120, a control system (not shown) may be configured to control or adjust the configuration or settings of the air supply system 110, misting and cooling system 112, and/or optional chiller 115 to produce cool and non-contaminated air 120 with desired temperature, moisture, and particle level.

According to one embodiment, datacenter system 100 further includes an airflow delivery system configured to generate one or more airflows based on cool and non-contaminated air 120 to deliver the airflows of cool and non-contaminated air 120 to cool the rows of electronic racks 101-103. In this example, the airflow delivery system includes a first channel or tunnel 125 to deliver the cool and non-contaminated air 120 into the housing that houses the rows of electronic racks 101-103. In one embodiment, first channel 125 may include one or more pipes or tubes disposed underneath the floor or surface 104 (e.g., raised floor) that supports the rows of electronic racks 101-103. Multiple inlet ports (e.g., openings or windows) 131A-131B may be disposed on various locations of floor 104 to allow the airflow of the cool and non-contaminated air 120 to flow into the housing.

In one embodiment, the inlet ports 131A-131B are arranged and disposed within a proximity or at the bottom of cool air aisles 106A-106B of floor 104. Optionally, a fan or fans may be mounted on at least some of the inlet ports 131A-131B to draw or take in the cool and non-contaminated air 120 from channel 125 upwardly into cool air aisles 106A-106B. In one embodiment, each of rows of electronic racks 101-103 includes one or more fans mounted thereon to direct the cool and non-contaminated air from a cool air aisle to a hot air aisle, flowing through the servers mounted on the electronic racks to exchange the heat generated by the servers due to their respective operations. For example, row of electronic racks 101 includes one or more fans to draw the cool and non-contaminated air from cool aisle 106A to hot air aisle 105A, traveling through the servers of row 101. Due to the heat exchange, the airflow flowing into hot air aisle 105A has a temperature higher than the temperature of the airflow received in cool air aisle 106A. Such heat exchange of an airflow leads to a temperature reduction of the servers, without contaminating or damaging hardware of the servers due to particles or pollutants in the air.

According to one embodiment, ceiling 107 of the housing includes one or more outlet ports (opening or windows) 132A-132B disposed within a proximity or on top of hot air aisles 105A-105B to allow the hot or warm air to be exhausted upwardly into second channel or tunnel 126, which will be directed to the external environment. A fan may be optionally disposed or mounted on at least some of outlets 132A-132B to exhaust the hot or warm air from hot air aisles 105A-105B into tunnel 126. The cool air aisles 106A-106B and hot air aisles 105A-105B are configured in an alternate manner with respect to rows of electronic racks 101-103. In one embodiment, rows of electronic racks 101-103 are arranged in a specific configuration in which each row is sandwiched between a cool air aisle and a hot air aisle. The rows of electronic racks 101-103 are arranged in such a way that most of the cool and non-contaminated air 120 will flow through the servers of the electronic racks 101-103 from cool air aisles 106A-1106B to hot air aisles 105A-105B respectively.

Further, according to another embodiment, a liquid recycle system (not shown) may be utilized to collect and recycle the liquid drops with the pollutants or particles collected from the air. Specifically, a liquid separation blade is utilized to collect and prevent any of the liquid droplets to travel with the air into the racks of IT equipment of a data center. A moisture control system may be utilized to control or adjust the air moisture to an optimal desirable level by adjusting a liquid flow as well as injecting recirculated air for a predetermined air moisture level. The conditioned, purified, cooled, and moisture air is then used to cool the entire fleet of the hardware in the data center. An air recycle system may also be utilized to recirculate some of the hot or warm air (but non-contaminated) to mix or generate new cool and non-contaminated air.

Note that the configuration of data center system 100 as shown in FIG. 1A are illustrated and described for the purpose of illustration only. Other configurations or layouts of the components may also be applied. Air supply system 110, misting and cooling system 112, and/or chiller 115 may be located in a variety of locations with respect to the housing of data center system 100. For example, air supply system 110, misting and cooling system 112, and/or chiller 115 may be located external to the housing (e.g., on the floor or from a remote or distant location) and the cool and non-contaminated air 120 may be delivered through a pipe coupled to channel 125. Other configurations may exist.

Figure 2:
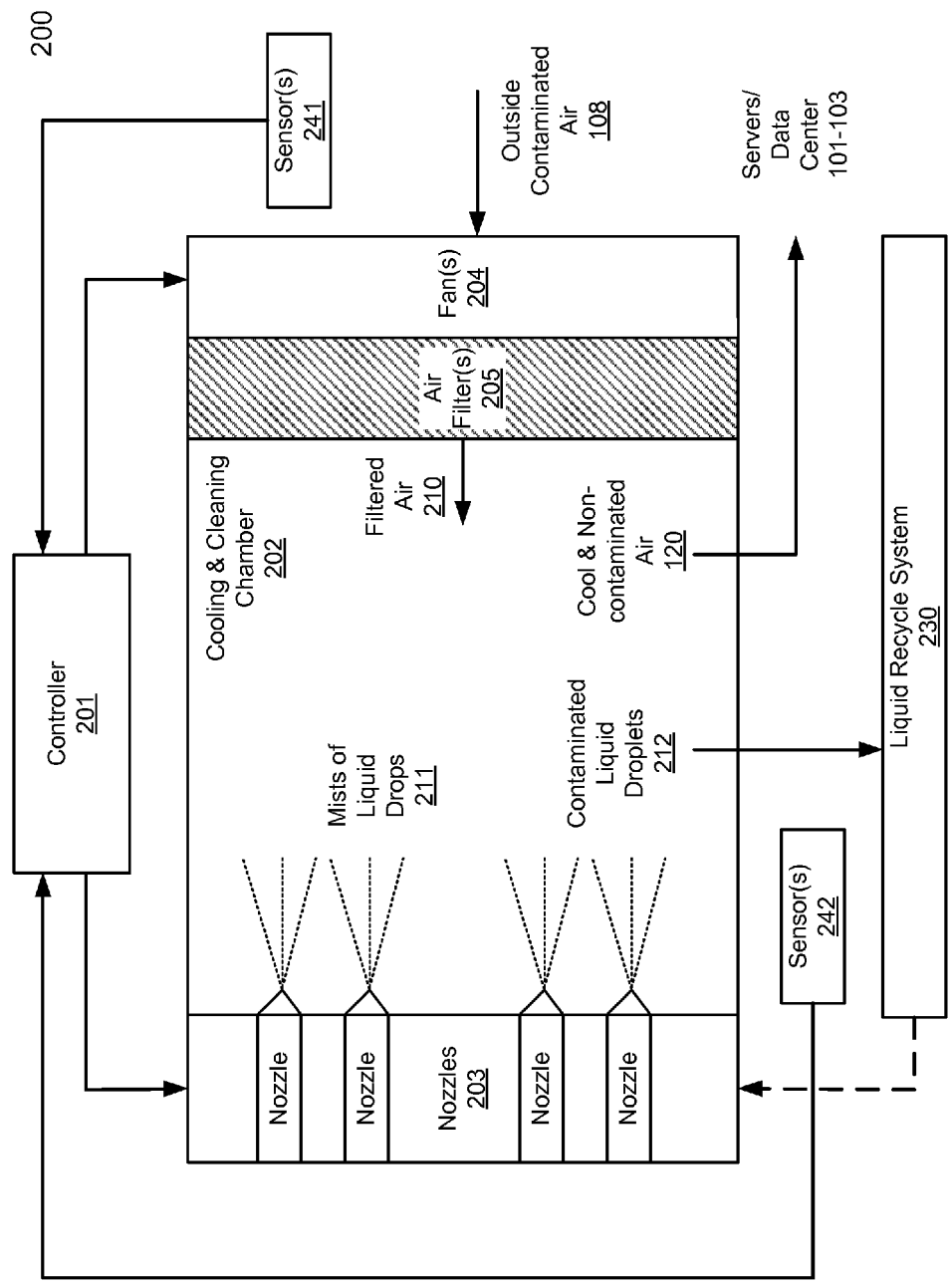
FIG. 2 is a block diagram illustrating an air washing and cooling system according to one embodiment of the invention.

FIG. 2 is a block diagram illustrating an air washing and cooling system according to one embodiment of the invention. System 200 may be implemented as part air supply system 110 and misting and cooling system 112 of data center system 100 of FIG. 1. Referring to FIG. 2, in one embodiment, system 200 includes a cooling and cleaning chamber 202 to receive contaminated air, an array of nozzles 203 to spray or blow mists of liquid drops into the contaminated air, and a controller 201 configured to control nozzles 203 to produce mists of liquid drops with a proper size and velocity or pressure.

As described above, contaminated air 108 is drawn by an air supply system, in this example, having one or more fans 204 and one or more air filters 205 to take in or draw contaminated air 108 into cooling and cleaning chamber 202. Note that the relative positions of fans 204 and filters 205 may be swapped (e.g., filters 205 are on the outside of fans 204) or arranged in other layouts. Filters 205 are configured to filter a portion of particles or pollutants in contaminated air 108 to generate filtered air 210 into cooling and cleaning chamber 202. Nozzles 203 arranged in an opposite direction with respect to filtered air to blow or spray mists of liquid drops 211 directly into filtered air 210 for direct contact in the opposite direction (e.g., head on). The size and velocity of liquid drops 211 are configured in such way that a majority of the particles, dusts, or pollutants of filtered air 210 will be collected into contaminated liquid drops 212. Filtered air 210 with reduced particles becomes cool and non-contaminated air 120, which will be directed to rows of electronic racks 101-103 as described above.

In addition, according to another embodiment, system 200 further includes a first sensor or sensors 241 to monitor air quality attributes of contaminated air 108, such as particle counts, moisture, air velocity, air pressure, and temperature. The information collected by sensor 241 may be used by controller 201 to control or adjust nozzles 203 to generate mists of liquid drops with different attributes or characteristics, such as, for example, a size, velocity or pressure, temperature of the liquid droplets, such that a maximum amount of particles or pollutants of the contaminated air 108 can be collected by the liquid drops. System 200 may further include a second sensor or sensors 242 to monitor the air quality attributes, such as particle counts, moisture, airflow rate, air pressure, and temperature, of non-contaminated air 120. The configuration of nozzles 203 may be adjusted accordingly, for example, to generate liquid drops with different sizes, velocities, and/or temperatures. Based on the data received from sensor 241 and/or sensor 241, controller 201 determines the proper or optimum settings of nozzles 203 (e.g., liquid pressure, density of liquid drops, and size of liquid drops), as well as other components such as air supply system 110 and chiller 115 of FIG. 1. Nozzles 203 may be individually controlled by controller 201, for example, by individually turning on or off, or adjusting operating parameters (e.g., spray direction or angle, velocity, temperature, liquid pressure, fineness of liquid drops, etc.) of nozzles 203.

Further, according to one embodiment, system 200 further includes a liquid recycle system 230 to collect contaminated liquid drops 212. Liquid recycle system 230 further includes a liquid separation device to separate the liquid drops from non-contaminated air 120 to prevent additional liquid drops from being carried by the cool and non-contaminated air 120 onto rows of electronic racks 101-103. Alternatively, liquid separation device may be implemented as a separate device independent of liquid recycle system 230. Liquid recycle system 230 may further include a filtering and cleaning mechanism to clean contaminated liquid drops 212 by removing the collected particles or pollutants. The clean liquid can then be reused by nozzles 203. Certain chemicals may be added to the liquids and/or filtered air in chamber 202 to further improve the efficiency of cooling and cleaning contaminated air 108.

Figure 3:
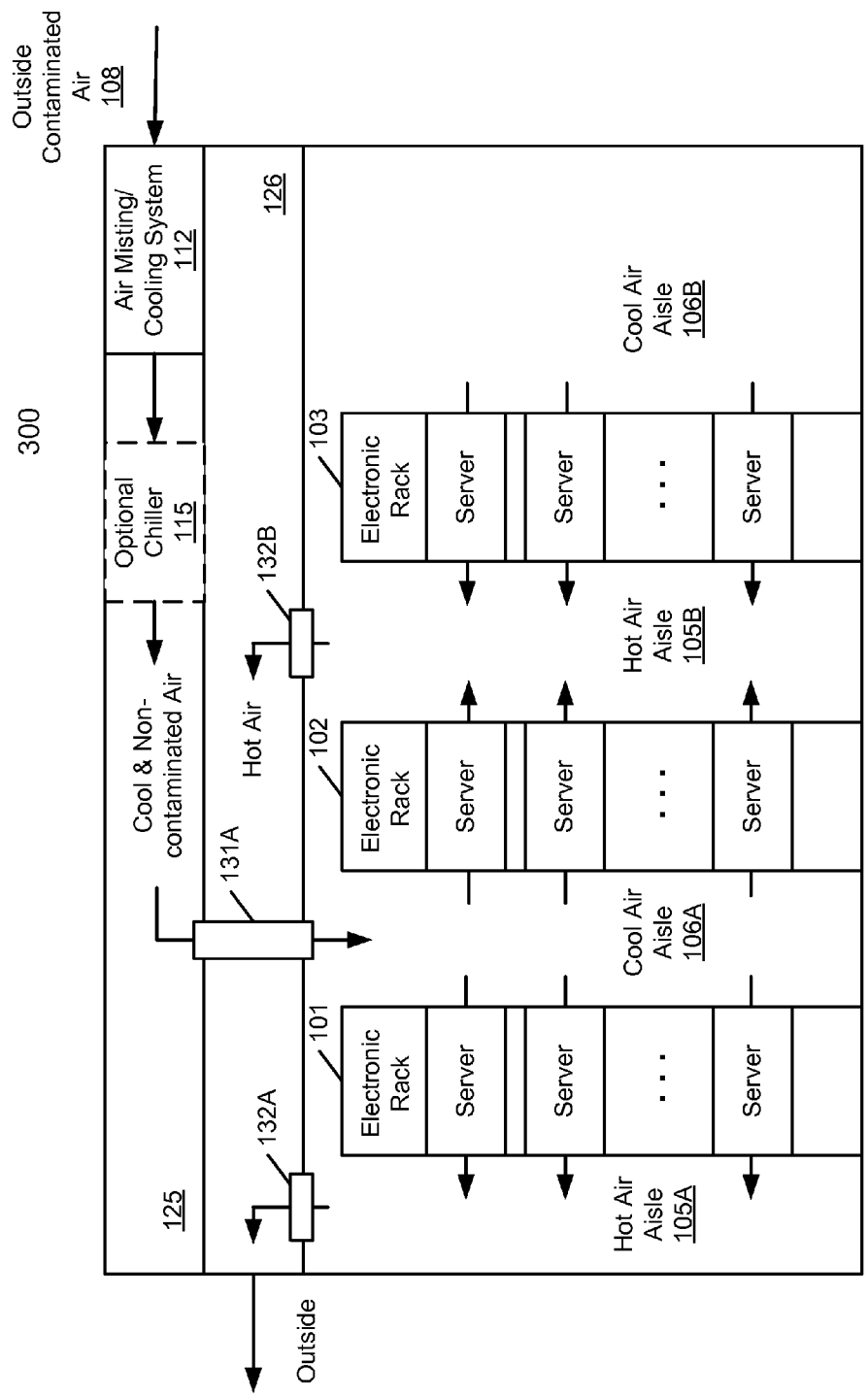
FIG. 3 is a block diagram illustrating a data center system according to another embodiment of the invention.

FIG. 3 is a block diagram illustrating a data center system according to another embodiment of the invention. Referring to FIG. 3, in this embodiment, channel 125 that delivers cool and non-contaminated air 120 is also disposed on the same side of channel 126 that collects hot air with the heat exchanged through servers of electronic racks 101-103. The rows of electronic racks 101-103 do not have to be disposed on a raised floor as shown in FIG. 1. Note that the specific configuration of data center system 300 may be shown for the purpose of illustration only; other configurations may exist. For example, the positions of channels 125 and 126 may be swapped, where channel 126 may be disposed on the top of channel 125. Again, the locations of air misting and cooling system 112 and optional chiller 115 are shown for the purpose of illustration only.

Figure 4:
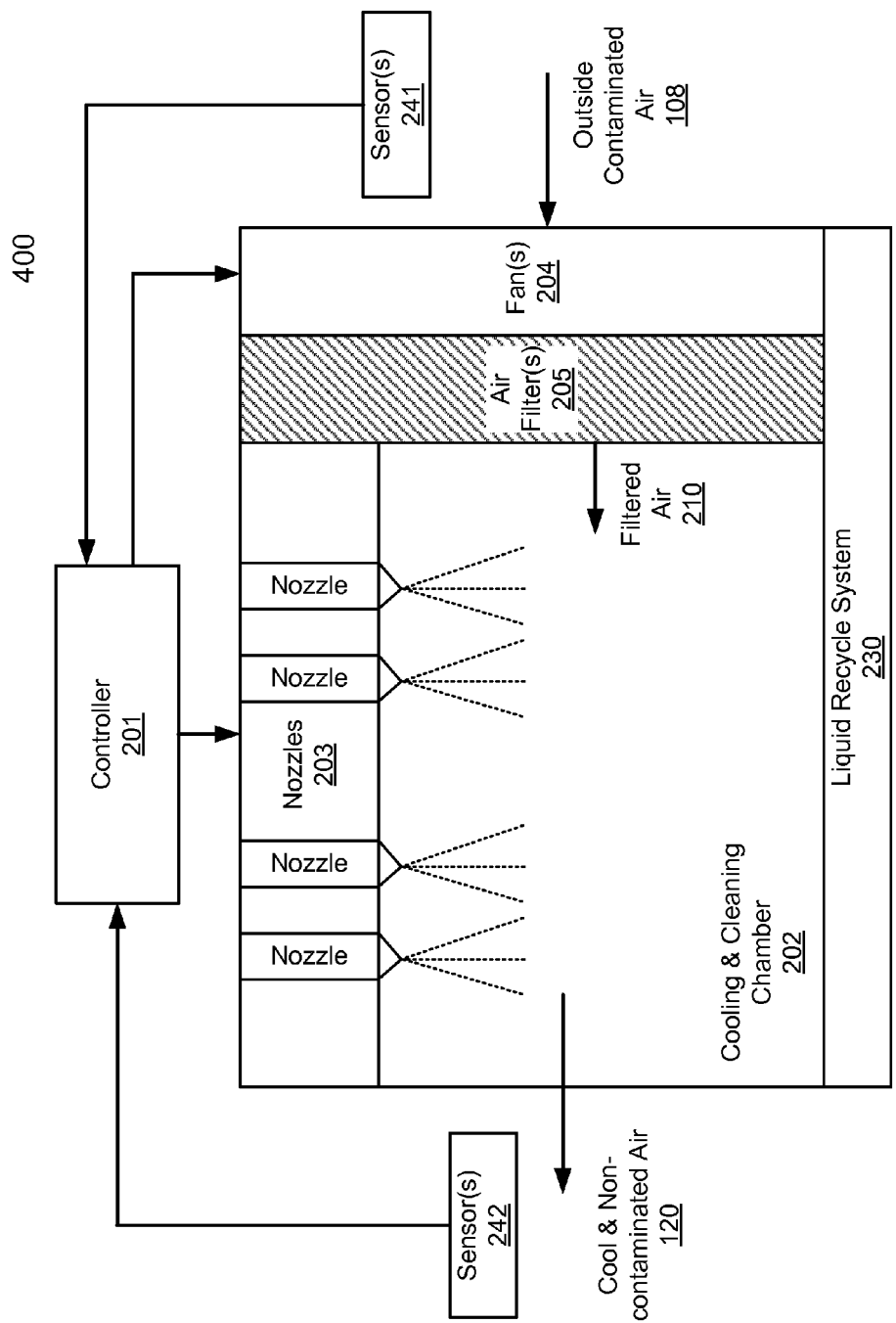
FIG. 4 is a block diagram illustrating a cooling and cleaning system according to another embodiment of the invention.

FIG. 4 is a block diagram illustrating a cooling and cleaning system according to another embodiment of the invention. Referring to FIG. 4, in this embodiment, similar to system 200, system 400 includes an air supply system having one or more fans 204 to take in or draw external contaminated air 108 into cooling and cleaning chamber 202 and one or more filters 205 to filter the contaminated air 108 to generate filtered air 210. However, in this embodiment, nozzles 203 are disposed on the ceiling of cooling and cleaning chamber 202 to spray or blow mists of liquid drops vertically (e.g., downwardly) into filtered air 210 that flows horizontally. The liquid drops directly contact filtered air 210 to collect and remove a significant portion of particles or pollutants contained therein to generate cool and non-contaminated air 120. In this example, the direction of the liquid drops is perpendicular to the direction of the filtered air 210. However, the liquid drops and filtered air 210 can be configured to intersect or contact with each other in any directions or angles. The liquid drops with collected particles or pollutants are then collected by liquid recycle system 230. The settings of the nozzles 203 may be controlled and adjusted by controller 201 based on data collected from sensors 241-242 as described above. Controller 201 may include a processor or processors and a machine-readable medium storing executable instructions, which when executed by a processor, cause the processor to perform an action, including generating and transmitting a signal to control or manage other components of the data center system, such as, for example, air supply system 110, misting and cooling system 112, chiller 115, liquid recycle system 230, as well as other systems (e.g., moisture control system, air recycle system).

Note that the cooling and cleaning techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before.

Figure 5:
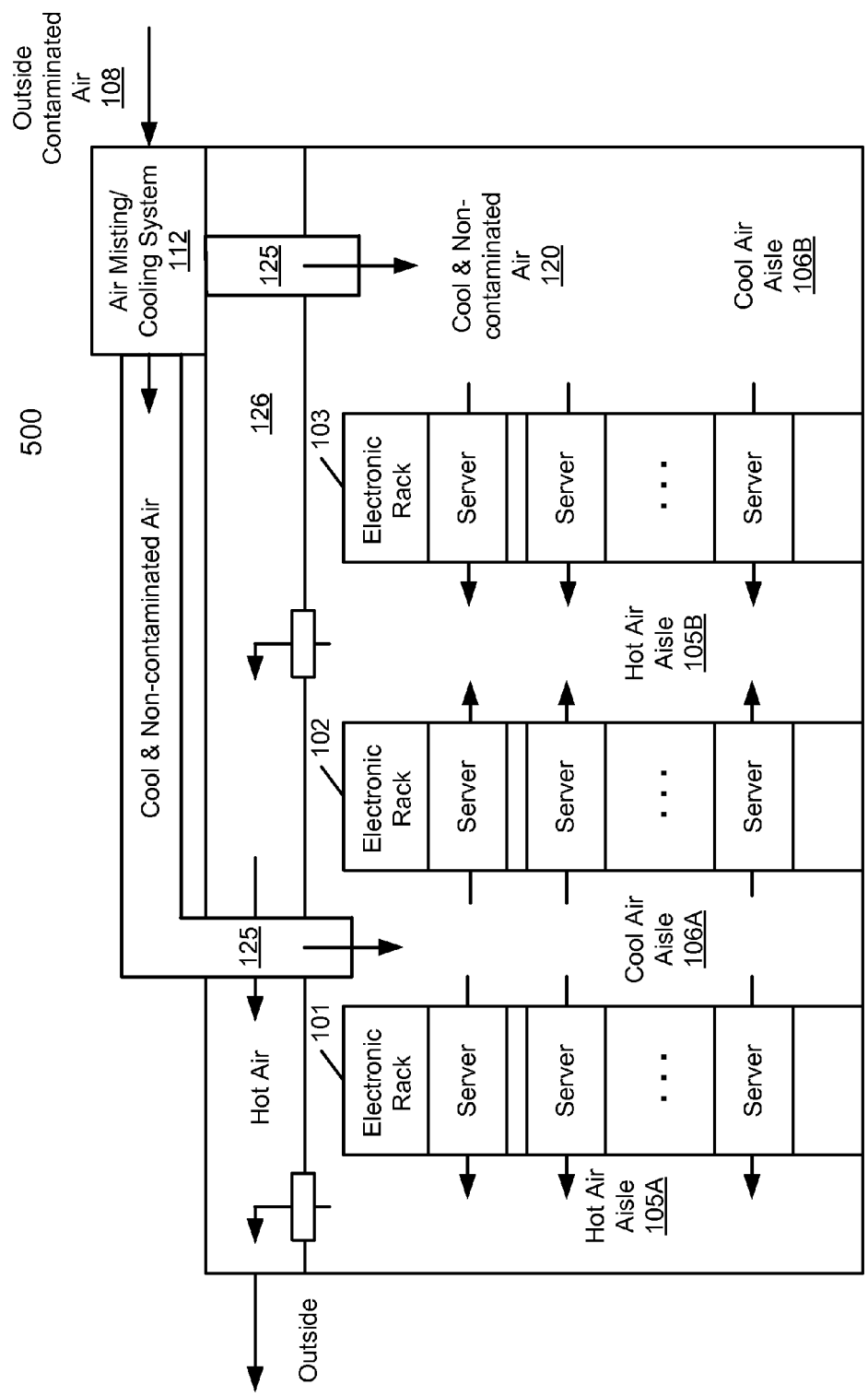
FIG. 5 is a block diagram illustrating a data center system according to another embodiment of the invention.

The techniques described above can also be applied to or work in conjunction with a performance optimized data center (POD), or portable on-demand or container data center, where racks of servers are housed in one or more individual containers or boxes. FIG. 5 is a block diagram illustrating a data center system according to another embodiment of the invention. Referring to FIG. 5, in this example, the data center is a POD or container data center. Misting and cooling system 112 is attached to the POD data center and supplies the cool and non-contaminated air inside the POD data center as described above.

Figure 6:
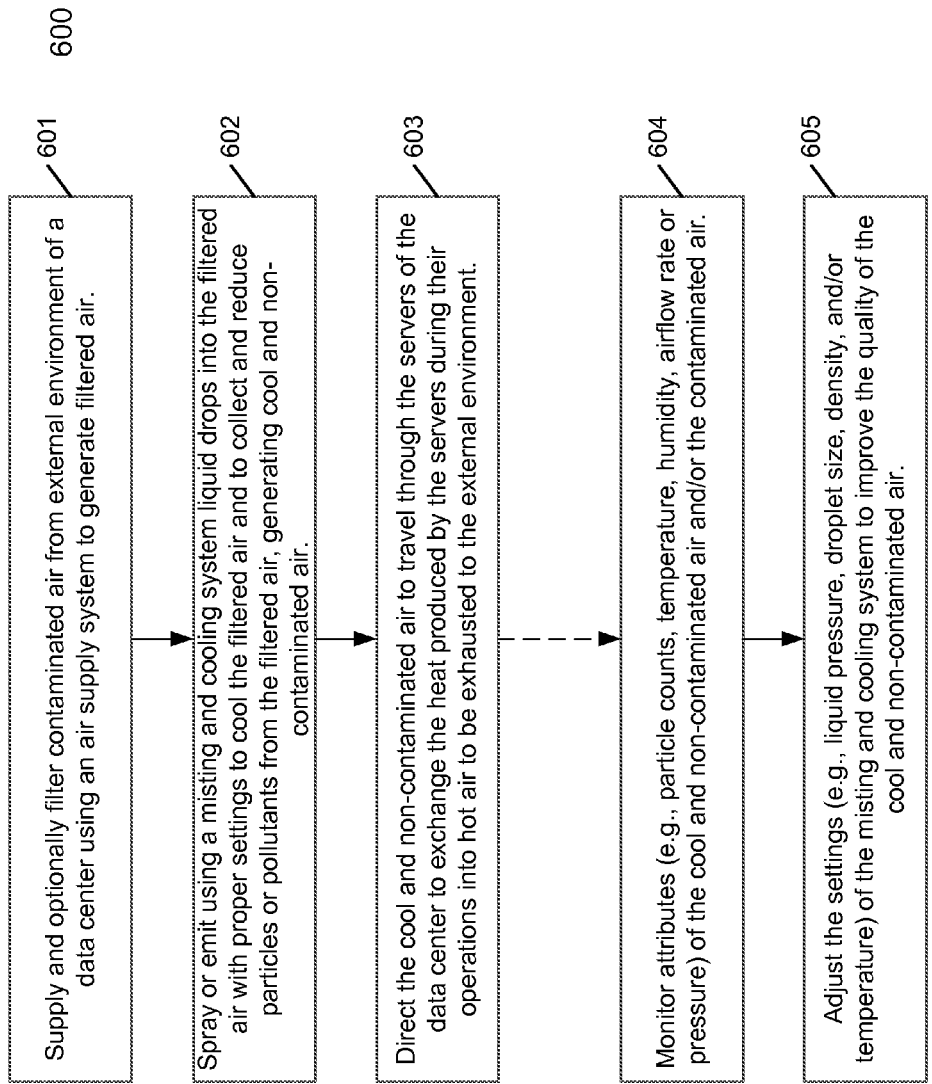
FIG. 6 is a flow diagram illustrating a process for cooling and cleaning fresh air to be used in a data center according to one embodiment of the invention.

FIG. 6 is a flow diagram illustrating a process for cooling and cleaning fresh air to be used in a data center according to one embodiment of the invention. Process 600 may be performed by systems as shown in FIGS. 1-5. Referring to FIG. 6, at block 601, contaminated air is supplied from an external environment into a housing that house rows of electronic racks of a data center. The data center may be one of a traditional colocation data center, a greenfield data center, and a POD or container data center. At block 602, mists of liquid drops (e.g., water drops) are sprayed or blown into the contaminated air. The liquid drops have certain characteristics, such as proper size and velocity to collect or reduce the particles or pollutants contained in the contaminated air, as well as reducing the temperature of the air due to vaporization of the liquid drops, generating cool and non-contaminated air. The non-contaminated air refers to the air having a level of particles or pollutants that is below a predetermined threshold. At block 603, the cool and non-contaminated air is then directed to flowing through the IT equipment of the electronic racks such as servers. The cool and non-contaminated air is to exchange the heat produced by the servers due to their operations into hot air to be exhausted to the external environment. Meanwhile, through a separate processor or thread at block 604, the air quality attributes (e.g., particle counts, temperature, humidity, airflow rate, and/or air pressure) of the contaminated air and non-contaminated air are monitored. At block 605, the monitoring information is then used to control the settings or configuration (e.g., liquid pressure, droplet size, density, and/or temperature) of the misting and cooling system to improve the quality of the cool and non-contaminated air.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
a housing to house a plurality of servers operating therein, the servers being arranged in a plurality of electronic racks;
an air supply system to receive contaminated air from an external environment of the housing, the contaminated air containing a plurality of particles;
a misting and cooling system coupled to the air supply system to receive the contaminated air and to clean and cool the contaminated air, wherein the misting and cooling system includes
a cooling and cleaning chamber to receive the contaminated air from the air supply system, and
a plurality of nozzles arranged to spray a plurality of liquid droplets into the contaminated air within the cooling and cleaning chamber, wherein the liquid droplets directly contact the particles of the contaminated air to collect and remove at least a portion of the particles contained in the contaminated air to generate non-contaminated air; and
an airflow delivery system coupled to the misting and cooling system to generate an airflow from the non-contaminated air, to cause the airflow to travel through the servers of the electronic racks to exchange heat generated by the servers due to operations of the servers, and to exhaust the airflow carrying the exchanged heat to the external environment outside of the housing.

2. The data center system of claim 1, wherein the liquid droplets further cause the non-contaminated air to have a first temperature that is lower than a second temperature of the contaminated air due to enthalpy changes of the liquid droplets to vapor.

3. The data center system of claim 1, wherein the air supply system comprises:
one or more fans to draw the contaminated air from the external environment into the housing; and
one or more air filters coupled to the fans to filter the contaminated air to generate filtered air, wherein the filtered air is cleaned and cooled by the misting and cooling system to generate the non-contaminated air.

4. The data center system of claim 1, wherein the misting and cooling system further comprises:
one or more sensors disposed at a plurality of locations, including a first sensor to measure particles of the contaminated air; and
a controller coupled to the sensors to adjust settings of at least the nozzles of the misting and cooling system based on data received from at least the first sensor to generate the liquid droplets in a size that is optimal to collect and remove the particles from the contaminated air.

5. The data center system of claim 4, wherein the controller is configured to adjust at least one of a liquid pressure, a density of the liquid droplets, and a size of the liquid droplets.

6. The data center system of claim 4, wherein the one or more sensors further comprise a second sensor disposed within the housing to measure air quality attributes of the non-contaminated air, wherein the controller adjusts the settings of the misting and cooling system further based on data received from the second sensor.

7. The data center system of claim 6, wherein the air quality attributes comprise at least one of remaining particle counts, moisture, an airflow rate, air pressure, and a temperature of the non-contaminated air.

8. The data center system of claim 1, further comprising a liquid separation device to collect and separate the liquid droplets carrying the particles that are extracted from the contaminated air from the non-contaminated air to prevent the liquid droplets from traveling with the non-contaminated air flowing through the server.

9. The data center system of claim 8, further comprising a liquid recycle system coupled to the liquid separation device to remove the particles from the liquid droplets, such that the liquid droplets without the particles can be reused by the misting and cooling system.

10. The data center system of claim 8, further comprising an air moisture control system coupled to the misting and cooling system to recirculate at least a portion of the non-contaminated air after heat exchange with the servers and to mix the recirculated non-contaminated air with new non-contaminated air generated by the misting and cooling system to adjust moisture of further non-contaminated air to be fed to the servers.

11. The data center system of claim 10, wherein the air moisture control system further communicates with the misting and cooling system to adjust a liquid flow emitted from the nozzles to further control the moisture of the further non-contaminated air to be fed to the servers.

12. The data center system of claim 1, wherein the electronic racks are arranged into a plurality of rows of electronic racks, wherein the rows of electronic racks form a plurality of hot air aisles and a plurality of cool air aisles between the rows of electronic racks in an alternate manner, and wherein the non-contaminated air is injected into the cool air aisle and the non-contaminated air with heat exchange is exhausted from the hot air aisle to the external environment.

13. The data center system of claim 12, wherein each row of the electronic racks includes one or more fans to direct the non-contaminated air from an adjacent cool air aisle from one side of the row towards an adjacent hot air aisle of the other side of the row.

14. The data center system of claim 12, wherein the airflow delivery system comprises:
a first channel to receive the non-contaminated air from the misting and cooling system and to distribute the non-contaminated air to the cool air aisles; and
a second channel to receive the non-contaminated air with heat exchanged from the hot air aisles and to deliver the non-contaminated air with heat exchanged to the external environment.

15. The data center system of claim 14, wherein the first channel is disposed under a surface that supports the rows of electronic racks to distribute the non-contaminated air upwardly into the cool air aisle, and wherein the second channel is disposed on top and over the rows of electronic racks to collect the non-contaminated air with heat exchanged from the hot air aisle below.

16. The data center system of claim 14, wherein the first channel is disposed on top and over the rows of electronic racks to distribute the non-contaminated air downwardly into the cool air aisle, and wherein the second channel is disposed on top and over the rows of electronic racks to collect the non-contaminated air with heat exchanged from the hot air aisle below.

17. A method operated by a data center system, comprising:
providing a housing to house a plurality of servers operating therein, the servers being arranged in a plurality of electronic racks;
receiving by an air supply system contaminated air from an external environment of the housing and to inject the contaminated air into the housing, the contaminated air containing a plurality of particles;
cooling and cleaning, by a misting and cooling system coupled to the air supply system, the contaminated air, including
receiving in a cooling and cleaning chamber the contaminated air from the air supply system, and
spraying using a plurality of nozzles a plurality of liquid droplets into the contaminated air within the cooling and cleaning chamber, wherein the liquid droplets directly contact the particles of the contaminated air to collect and remove at least a portion of the particles contained in the contaminated air to generate non-contaminated air; and
generating, by an airflow delivery system coupled to the misting and cooling system, an airflow from the non-contaminated air, to cause the airflow to travel through the servers of the electronic racks to exchange heat generated by the servers due to operations of the servers, and to exhaust the airflow carrying the exchanged heat to the external environment outside of the housing.

18. The method of claim 17, wherein the liquid droplets further cause the non-contaminated air to have a first temperature that is lower than a second temperature of the contaminated air due to enthalpy changes of the liquid droplets to vapor.

19. The method of claim 17, wherein the air supply system comprises:
one or more fans to draw the contaminated air from the external environment into the housing; and
one or more air filters coupled to the fans to filter the contaminated air to generate filtered air, wherein the filtered air is cleaned and cooled by the misting and cooling system to generate the non-contaminated air.

20. The method of claim 17, wherein the misting and cooling system further comprises:
one or more sensors disposed at a plurality of locations, including a first sensor to measure particles of the contaminated air; and
a controller coupled to the sensors to adjust settings of at least the nozzles of the misting and cooling system based on data received from at least the first sensor to generate the liquid droplets in a size that is optimal to collect and remove the particles from the contaminated air.

* * * * *